(12) United States Patent
Lu et al.

(10) Patent No.: US 11,533,816 B2
(45) Date of Patent: Dec. 20, 2022

(54) LOCKING DEVICE AND SERVER CABINET WITH SAME

(71) Applicant: Fulian Precision Electronics (Tianjin) Co., LTD., Tianjin (CN)

(72) Inventors: Wen-Hu Lu, Tianjin (CN); Zhen-Lei Li, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 118 days.

(21) Appl. No.: 17/025,363

(22) Filed: Sep. 18, 2020

(65) Prior Publication Data

US 2021/0368639 A1 Nov. 25, 2021

(30) Foreign Application Priority Data

May 19, 2020 (CN) .......................... 202010426479.0

(51) Int. Cl.
*H05K 5/02* (2006.01)
*E05B 57/00* (2006.01)

(52) U.S. Cl.
CPC ........... *H05K 5/0221* (2013.01); *E05B 57/00* (2013.01)

(58) Field of Classification Search
CPC .... H05K 5/0221; H05K 7/1487; E05B 57/00; E05C 3/00; E05C 3/006; E05C 3/12; E05C 3/122; E05C 3/124; E05C 3/14; E05C 19/06; Y10T 292/1061; Y10T 292/1083; Y10T 292/1084; Y10T 292/1085; Y10T 292/1092; Y10T 292/42; Y10T 292/444; Y10S 292/11; Y10S 292/30; Y10S 292/31; Y10S 292/37
See application file for complete search history.

(56) References Cited

U.S. PATENT DOCUMENTS

| | | | | |
|---|---|---|---|---|
| 6,407,912 B1* | 6/2002 | Chen | ........................ | G06F 1/183 312/223.1 |
| 6,457,788 B1* | 10/2002 | Perez | ...................... | G06F 1/181 312/265.5 |
| 6,721,183 B1* | 4/2004 | Chen | ........................ | G06F 1/181 16/404 |
| 7,252,351 B2* | 8/2007 | Chen | ........................ | G06F 1/181 312/223.2 |
| 7,735,669 B2* | 6/2010 | Liang | ...................... | G06F 1/181 220/4.21 |
| 8,118,377 B2* | 2/2012 | Chen | ........................ | G06F 1/181 312/319.1 |

(Continued)

FOREIGN PATENT DOCUMENTS

TW I311898 B 7/2009

*Primary Examiner* — Hanh V Tran
(74) *Attorney, Agent, or Firm* — ScienBiziP, P.C.

(57) ABSTRACT

A space-saving locking device for a server cabinet which does not present sharp edges to a user during handling locks a first housing to a second housing and includes first and second locking members. The first locking member includes a clamping portion with one end defining a latching slot, the second locking member includes a locking portion matching the latching slot. When the first locking member is operated, the locking portion is latched to the latching slot, and the first locking member is locked to the second member. When the latching slot is detached from the latching portion in a predetermined direction, the first locking member and second locking member are unlocked.

16 Claims, 6 Drawing Sheets

(56) References Cited

U.S. PATENT DOCUMENTS

| | | | | |
|---|---|---|---|---|
| 8,911,034 | B2* | 12/2014 | Kuo | G06F 1/181 |
| | | | | 312/265.5 |
| 8,950,830 | B2* | 2/2015 | Chen | G06F 1/181 |
| | | | | 312/263 |
| 9,696,769 | B1* | 7/2017 | Hamilton | H05K 7/20127 |
| 10,356,938 | B1* | 7/2019 | Hsu | H05K 5/0208 |
| 10,477,719 | B1* | 11/2019 | An | H05K 7/1487 |
| 10,624,223 | B1* | 4/2020 | Tsorng | H05K 7/20727 |
| 11,134,578 | B2* | 9/2021 | Lin | H05K 5/023 |
| 11,212,934 | B2* | 12/2021 | Chang | H05K 5/03 |
| 2005/0023943 | A1* | 2/2005 | Fan | G06F 1/181 |
| | | | | 312/223.2 |
| 2007/0206348 | A1* | 9/2007 | Lin | G06F 1/181 |
| | | | | 361/727 |
| 2010/0007252 | A1* | 1/2010 | Liu | G06F 1/183 |
| | | | | 361/728 |
| 2014/0029214 | A1* | 1/2014 | Lu | H05K 7/1487 |
| | | | | 361/752 |
| 2019/0019608 | A1* | 1/2019 | Essary | H05K 5/0208 |
| 2019/0075666 | A1* | 3/2019 | Ehlen | H05K 7/1487 |
| 2019/0394893 | A1* | 12/2019 | Wu | H05K 5/0221 |
| 2020/0037457 | A1* | 1/2020 | Chen | H05K 7/1487 |
| 2021/0120686 | A1* | 4/2021 | Lin | H05K 7/16 |
| 2021/0360807 | A1* | 11/2021 | Yu | G06F 1/186 |

* cited by examiner

LOCKING DEVICE AND SERVER CABINET WITH SAME

FIELD

The subject matter herein generally relates to server construction and a locking device.

BACKGROUND

Space constraints in existing server cabinets allow only one locking device in the middle of an upper cover of the server. In this way, as the server is being handled, openings may appear in some locations, and the sharp edges of the openings may scratch the hand of a user.

Therefore, there is room for improvement within the art.

BRIEF DESCRIPTION OF THE DRAWINGS

Many aspects of the disclosure can be better understood with reference to the figures. The components in the figures are not necessarily drawn to scale, the emphasis instead being placed upon clearly illustrating the principles of the disclosure.

DETAILED DESCRIPTION

Figure 1:
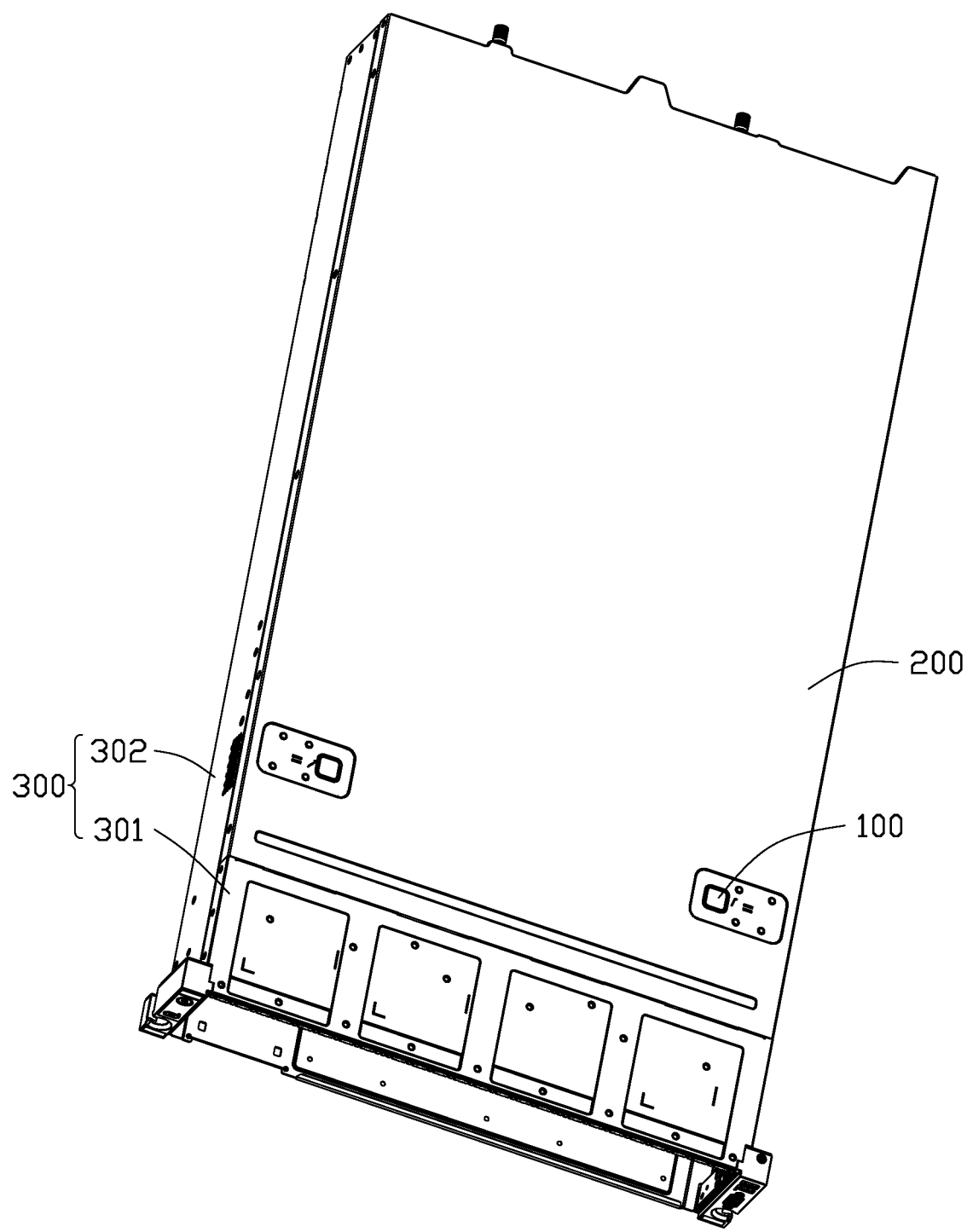
FIG. 1 is an isometric view of a server cabinet according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 illustrates a server cabinet 400. The server cabinet 400 includes a locking device 100, a first housing 200, and a second housing 300. The locking device 100 is configured to lock the first housing 200 to the second housing 300.

Figure 2:
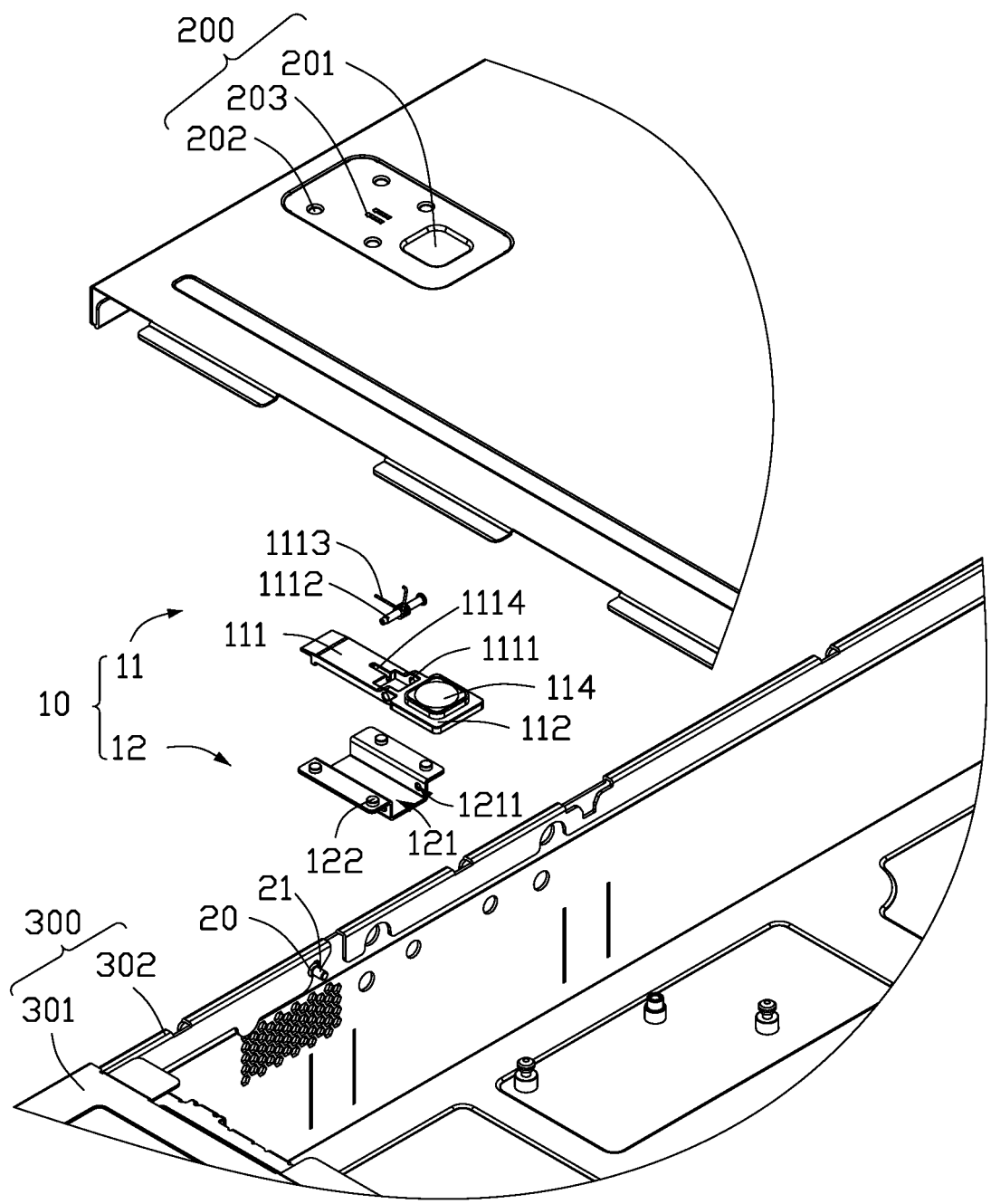
FIG. 2 is an exploded, isometric view of the server cabinet of FIG. 1.

As illustrated in FIG. 2, in this embodiment, the first housing 200 defines a through hole 201. The locking device 100 is positioned in the first housing 200 and is partially exposed from the through hole 201.

The second housing 300 includes a top wall 301 and two side walls 302. The two side walls 302 are oppositely arranged and are both connected to the top wall 301. The first housing 200 covers the side wall 302 and can be locked with the top wall 301 by the locking device 100. The size of the first housing 200 after locking with the top wall 301 matches the size of the side wall 302. When the first housing 200 moves and is locked to the top wall 301, the first housing 200 and the top wall 301 both cover sides of the side wall 302.

In this embodiment, the locking device 100 includes a first locking member 10 and a second locking member 20. The first locking member 10 is arranged on the first housing 200. The second locking member 20 is positioned on the second housing 300. Specifically, in this embodiment, the first locking member 10 is positioned on an inner side of a top wall of the first housing 200. The second locking member 20 is positioned on the side wall 302 of the second housing 300. The location of the first locking member 10 corresponds to the location of the second locking member 20. When the first locking member 10 is locked to the second locking member 20, the first housing 200 and the side wall 302 are locked.

In this embodiment, one end of the second locking member 20 is detachably mounted on the side wall 302. The other end of the second locking member 20 forms a locking portion 21. The locking portion 21 is substantially a circular rod. The locking portion 21 is configured to clamp with the first locking member 10. In other embodiments, one end of the second locking member 20 can also be directly fixed to the side wall 302.

In this embodiment, the first locking member 10 includes a clamping portion 11 and a connecting portion 12. The clamping portion 11 is detachably mounted on the connecting portion 12. The clamping portion 11 is configured to engage with the locking portion 21 of the second locking member 20. The connecting portion 12 is configured to be fixed to the first housing 200.

The connecting portion 12 has a substantially rectangular sheet structure. The connecting portion 12 is connected to both the first housing 200 and the clamping portion 11. Specifically, the connecting portion 12 is bent through four right angles to form a through groove 121. The connecting portion 12 forms at least one fixing portion 122 at a topmost bending portion. The through groove 121 accommodates the clamping portion 11 so that the clamping portion 11 is positioned on the connecting portion 12.

In this embodiment, the top wall of the first housing 200 also defines a fixing hole 202. The fixing hole 202 corresponds to the fixing portion 122. By passing the fixing portions 122 through the fixing holes 202, the connecting portion 12 of the first locking member 10 is fixed inside the first housing 200.

Figure 3:
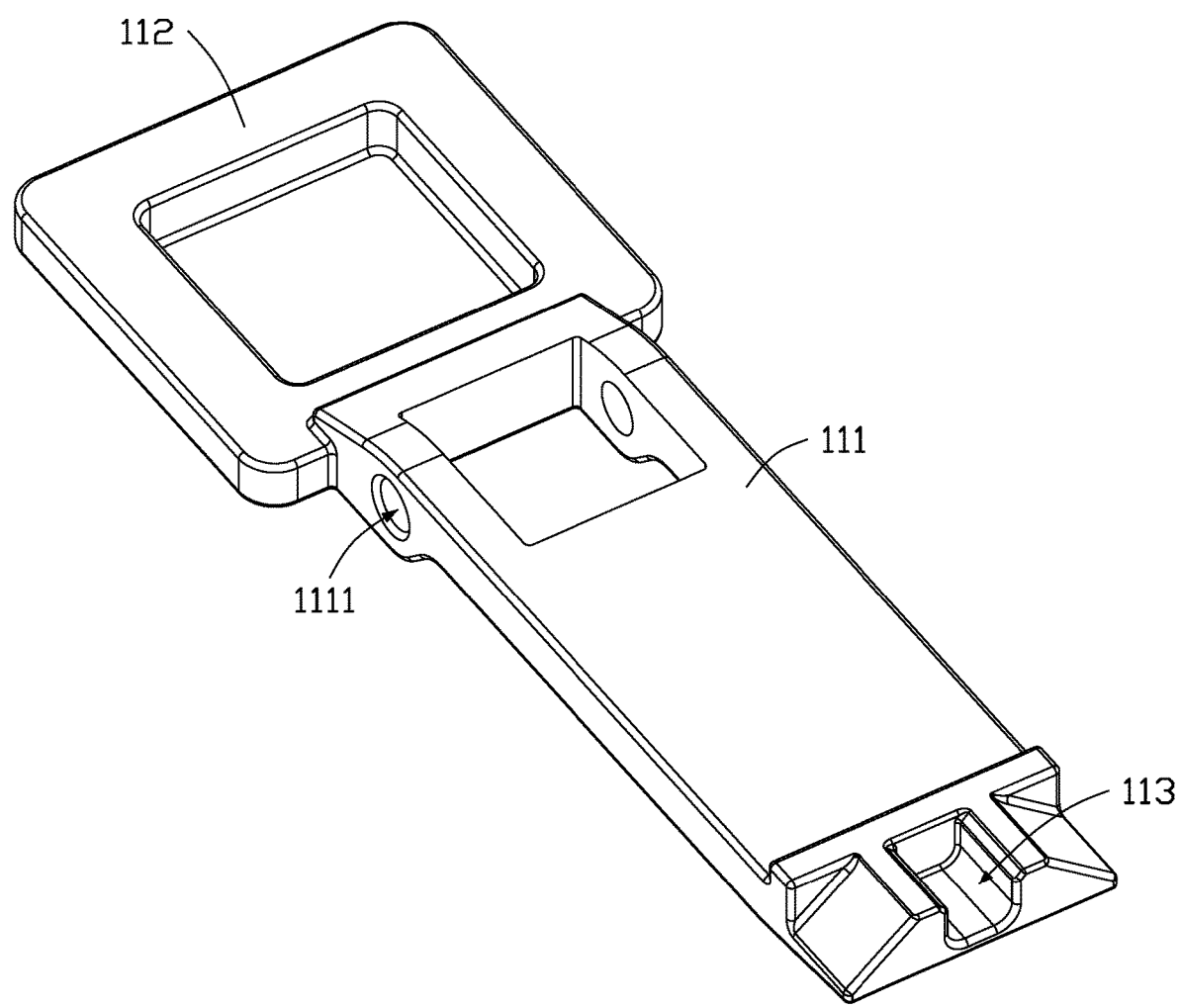
FIG. 3 is an isometric view of a clamping portion of the server cabinet of FIG. 2.

In this embodiment, the clamping portion 11 is substantially tongue-shaped. The clamping portion 11 includes a receiving portion 111 and a button portion 112. The receiving portion 111 is received in the through groove 121 of the connecting portion 12. One end of the receiving portion 111 defines a latching slot 113 with an open end (refer to FIG. 3). A cross section formed by the latching slot 113 and the receiving portion 111 is substantially triangular. In this embodiment, one end of the receiving portion 111 is close to the same side of the two sides, and a recess into the extended slope of the triangle forms the latching slot 113. The latching slot 113 can be locked to the locking portion 21 to lock the first locking member 10 to the second locking member 20.

The button portion 112 is substantially rectangular. The button portion 112 is positioned at the other end of the receiving portion 111, that is, the button portion 112 is positioned at an end away from the latching slot 113. The button portion 112 is exposed from the through hole 201 of the first housing 200. After the latching slot 113 is clamped in the locking portion 21, the latching slot 113 opposite to the button portion 112 moves in a direction opposite to the pressing direction when the button portion 112 is pressed. The latching slot 113 can be separated from the locking portion 21 in a predetermined direction, for example, a vertical direction. In other embodiments, the receiving portion 111 and the button portion 112 may be integrally formed.

In this embodiment, a pressing sheet 114 is further formed on the surface of the button portion 112 close to the first housing 200. The pressing sheet 114 is positioned on the button portion 112. The pressing sheet 114 is colored to make it easy to be distinguished, so that the location of the button portion 112 can be clearly found. The pressing sheet 114 may be a circular sheet structure. In this embodiment, the pressing sheet 114 can be positioned on the button portion 112, or the pressing sheet 114 can be integrally formed with the button portion 112.

In this embodiment, the two sides of the receiving portion 111 close to one end of the button portion 112 extend in a direction away from the connecting portion 12. The receiving portion 111 further defines a first hinge hole 1111. A second hinge hole 1211 is also defined at the side wall of the through groove 121. The second hinge hole 1211 corresponds to the first hinge hole 1111. By passing a hinge shaft 1112 sleeved with a torsion spring 1113 through the second hinge hole 1211 and the first hinge hole 1111, the clamping portion 11 is rotatably connected to the connecting portion 12.

In this embodiment, when the receiving portion 111 is rotatably connected to the connecting portion 12, a gap exists between an end of the receiving portion 111 close to the latching slot 113 and the topmost part of the through groove 121, so that the latching slot 113 is easily separated from the locking portion 21.

In this embodiment, a location of the receiving portion 111 close to the button portion 112 defines a notch 1114. When the hinge shaft 1112 passes through the second hinge hole 1211 and then the first hinge hole 1111, a tail end of the torsion spring 1113 can be inserted into the notch 1114. Correspondingly, a blocking portion 203 (shown in FIG. 2) is further positioned inside the first housing 200. A projection of the blocking portion 203 on the clamping portion 11 is located on one side of the notch 1114. The blocking portion 203 prevents the deviation of the tail end of the torsion spring 1113 from its original location after the server cabinet 400 is unlocked. For example, when the button portion 112 is pressed, the tail end of the torsion spring 1113 will escape from the notch 1114 and form a certain angle with the receiving portion 111. In this way, when the blocking portion 203 is provided and is locked again, the tail end of the spring 1123 can be inserted into the notch 1114. The blocking portion 203 prevents the tail end of the spring 1123 from being inserted into the notch 1114 when it is locked again.

In this embodiment, when the locking device 100 is assembled, firstly, the receiving portion 111 of the clamping portion 11 is fixedly received in the through groove 121 of the connecting portion 12. Then the hinge shaft 1112 sleeved with the torsion spring 1113 passes through the second hinge hole 1211 and the first hinge hole 1111 in sequence. The tail end of the torsion spring 1113 is inserted into the notch 1114. In this way, the clamping portion 11 is rotatably positioned on the connecting portion 12. The fixing portion 122 is fixed at the fixing hole 202 so that the first locking member 10 is installed inside the first housing 200. At this time, the button portion 112 to which the pressing sheet 114 is attached is exposed from the through hole 201.

Figure 4:
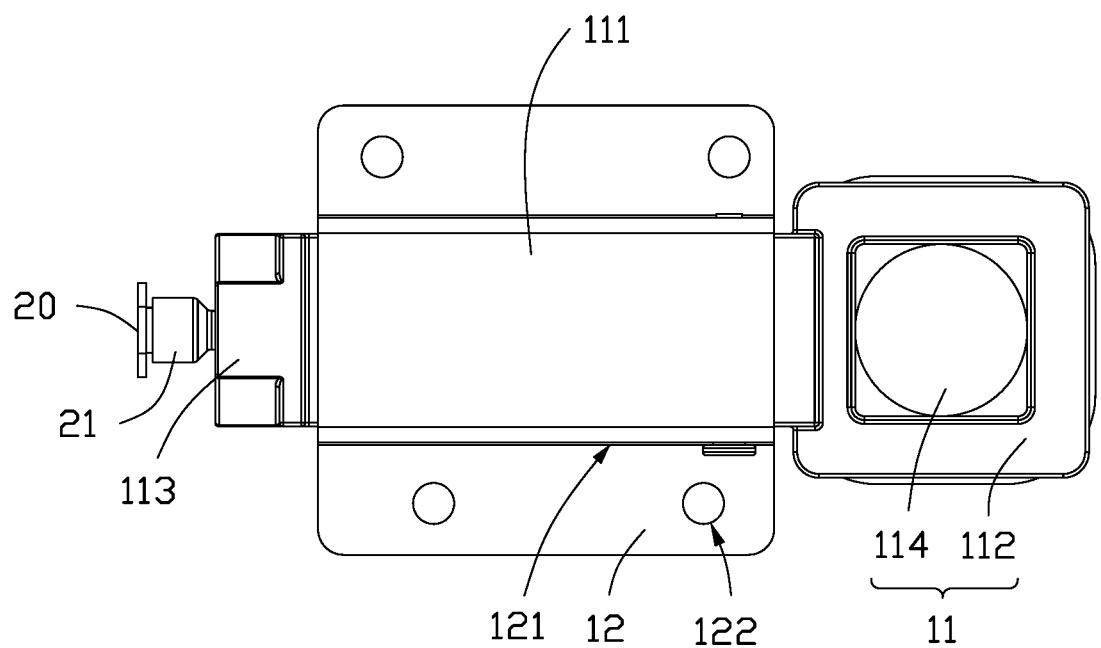
FIG. 4 is an assembled, isometric view of a locking device of the server cabinet of FIG. 2.

As illustrated in FIG. 4, the latching slot 113 at one end of the receiving portion 111 is suspended on the connecting portion 12. The button portion 112 at the other end of the receiving portion 111 is also suspended on the connecting portion 12. That is, the latching slot 113 and the button portion 112 are both suspended at the ends of the connecting portion 12. Then the second locking member 20 is fixed to the second housing 300. One end of the locking portion 21 of the second locking member 20 is positioned close to the direction of the first locking member 10.

Figure 5:
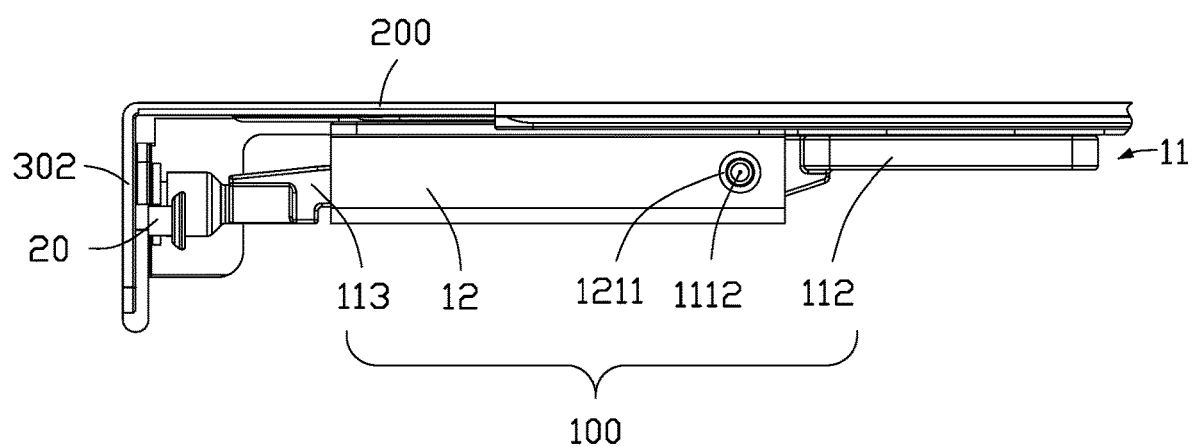
FIG. 5 is a schematic diagram of the locking device of FIG. 4 when locked.

As illustrated in FIG. 5, when the server cabinet 400 is locked, first, the first housing 200 covers the side wall 302 of the second housing 300, and the first housing 200 is pushed toward the top wall 301. When the first housing 200 is pushed to a certain location, an inclined surface of the latching slot 113 of the clamping portion 11 comes into contact with the surface of the locking portion 21. Under the pushing force, the inclined surface of the latching slot 113 of the clamping portion 11 slides along the surface of the locking portion 21 toward the top wall 301. At this time, the inclined surface of the latching slot 113 of the clamping portion 11 is pushed up. As the clamping portion 11 continues to slide along the circular surface of the locking portion 21 and approaches the top wall 301, the latching slot 113 will cross the center of the locking portion 21, so that the latching slot 113 of the clamping portion 11 is locked to the locking portion 21. In this way, the first housing 200 and the second housing 300 are locked together.

Further, in the process of pushing horizontally, when the first locking member 10 positioned on the first housing 200 is moved to correspond to the second locking member 20, the opening direction of the latching slot 113 of the first locking member 10 corresponds to the locking portion 21. In this way, the locking portion 21 is engaged with the latching slot 113, and further, the first housing 200 is locked with the side wall 302 of the second housing 300. At this time, one end of the top wall of the first housing 200 moves to connect with the top wall 301 of the second housing 300, the first housing 200 and the top wall 301 of the second housing 300 are also locked, and the server cabinet 400 is completely locked.

Figure 6:
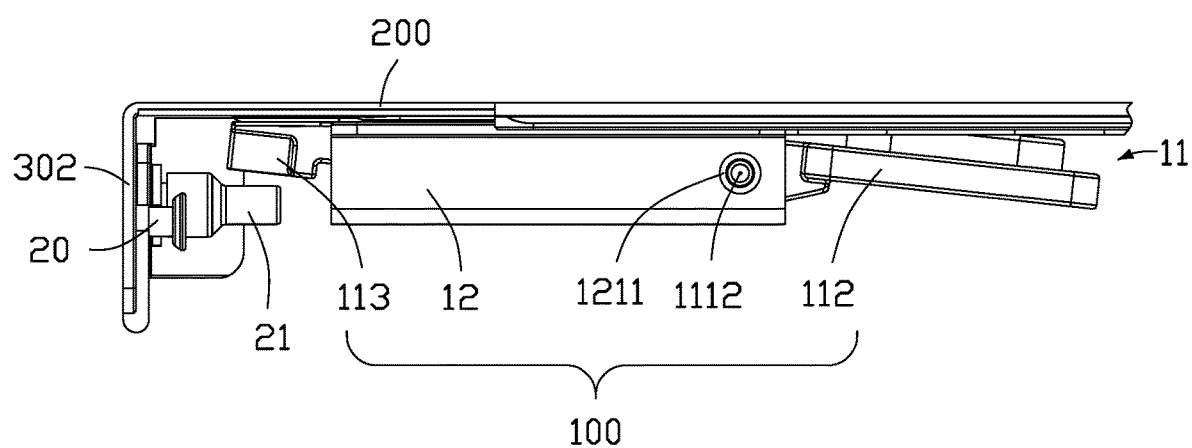
FIG. 6 is a schematic diagram of the locking device of FIG. 4 when unlocked.

As illustrated in FIG. 6, when the server cabinet 400 needs to be unlocked, the pressing sheet 114 can be pressed, and the latching slot 113 corresponds to the button portion 112 moves in a direction opposite to the pressing direction. In this way, the latching slot 113 is detached from the locking portion 21 in a predetermined direction. The first housing 200 is horizontally dragged away from the top wall 301 of the second housing 300. In this way, the first housing 200 and the second housing 300 are unlocked and separated.

In this embodiment, when unlocking the server cabinet 400, the first housing 200 and the side wall 302 are first unlocked. Specifically, the button portion 112 is pressed, and the locking portion 21 on the side wall 302 disengages from the latching slot 113 in a predetermined direction. The first housing 200 and the top wall 301 are thus unlocked.

Specifically, the top wall of the first housing 200 is dragged to move the first housing 200 away from the top wall 301. In this way, the server cabinet 400 is unlocked.

In this embodiment, when the clamping portion 11 rotates, the torsion spring 1113 sleeved on the hinge shaft 1112 builds up a torsion force. After the latching slot 113 is locked with the locking portion 21, it is easier to separate the latching slot 113 from the locking portion 21 in a predetermined direction by pressing the button portion 112.

In this embodiment, two locking devices 100 may be installed symmetrically on the side wall of the server cabinet 400. In this way, the balance and locking strength of the server cabinet 400 is maintained, and the problem of sharp-edged openings being uncovered between the first housing 200 and the second housing 300 is avoided, and better safety is achieved.

In this embodiment, the locking device 100 has a simple structure, and its overall thickness is only 8 mm, which can be applied to many other locations, the locking device 100 has a strong versatility.

In this embodiment, since the locking device 100 is positioned on the side wall of the server cabinet 400, space within the server cabinet 400 is not taken. The server cabinet 400 has a clean and simple appearance, the ID of the product is not affected, and the product is more coordinated while meeting its functions.

It is believed that the embodiments and their advantages will be understood from the foregoing description, and it will be apparent that various changes may be made thereto without departing from the scope of the disclosure or sacrificing all of its advantages, the examples hereinbefore described merely being illustrative embodiments of the disclosure.

What is claimed is:

1. A locking device for locking a first housing to a second housing, the locking device comprising:
   a first locking member positioned at the first housing and comprising a clamping portion, one end of the clamping portion defining a latching slot; and
   a second locking member positioned at the second housing, one end of the second locking member forming a locking portion matching the latching slot;
   wherein when the first locking member is operated, the locking portion is latched to the latching slot, the first locking member is locked to the second member; and
   wherein when the latching slot is detached from the locking portion in a predetermined direction, the first locking member and the second locking member are unlocked;
   wherein the clamping portion comprises a receiving portion and a button portion, one end of the receiving portion defines the latching slot, the button portion is positioned at another end of the receiving portion, the latching slot moves relative to the locking portion by pressing the button portion; when the button portion is operated, the receiving portion and the latching slot moves along a same direction, the receiving portion rotates for driving the latching slot to detach from the locking portion.

2. The locking device of claim 1, wherein the first locking member further comprises a connecting portion, the connecting portion is fixed to the first housing and is connected to the clamping portion.

3. The locking device of claim 2, wherein one side of the connecting portion defines a through groove, the through groove is configured to receiving the receiving portion.

4. The locking device of claim 3, wherein the connecting portion is bent to two sides away from the through groove and forms at least one fixing portion at the bending portion, the connecting portion is fixed to the first housing through the at least one fixing portion.

5. The locking device of claim 3, wherein two sides of one end of the receiving portion adjacent to the button portion extend along a direction away from the connecting portion and defines a first hinge hole, a side wall of the through groove defines a second hinge hole, the second hinge hole corresponds to the first hinge hole, a hinge shaft sleeved with a torsion spring passes through the second hinge hole and the first hinge hole, the clamping portion is rotatably connected to the connecting portion.

6. The locking device of claim 1, wherein the first housing defines a through hole, the button portion is exposed from the through hole.

7. The locking device of claim 1, wherein when the first housing provided with the first locking member moves toward the second housing until the latching slot is positioned corresponding to the locking portion, the first locking member is pressed, the locking portion is locked to the latching slot and the first housing is locked to the second housing.

8. The locking device of claim 1, wherein when the button portion is pressed, the latching slot is detached from the locking portion, the first housing is dragged to move along a direction away from the second housing, the first housing and the second housing are unlocked.

9. A server cabinet comprising:
   a first housing;
   a second housing; and
   a locking device comprising:
     a first locking member positioned at the first housing and comprising a clamping portion, one end of the clamping portion defining a latching slot; and
     a second locking member positioned at the second housing, one end of the second locking member forming a locking portion matching the latching slot;
     wherein when the first locking member is operated, the locking portion is latched to the latching slot, the first locking member is locked to the second member; and
   wherein when the latching slot is detached from the locking portion in a predetermined direction, the first locking member and the second locking member are unlocked;
   wherein the clamping portion comprises a receiving portion and a button portion, one end of the receiving portion defines the latching slot, the button portion is positioned at another end of the receiving portion, the latching slot moves relative to the locking portion by pressing the button portion; when the button portion is operated, the receiving portion and the latching slot moves along a same direction, the receiving portion rotates for driving the latching slot to detach from the locking portion.

10. The server cabinet of claim 9, wherein the first locking member further comprises a connecting portion, the connecting portion is fixed to the first housing and is connected to the clamping portion.

11. The server cabinet of claim 10, wherein one side of the connecting portion defines a through groove, the through groove is configured to receiving the receiving portion.

12. The server cabinet of claim 11, wherein the connecting portion is bent to two sides away from the through groove and forms at least one fixing portion at the bending portion, the connecting portion is fixed to the first housing through the at least one fixing portion.

13. The server cabinet of claim 11, wherein two sides of one end of the receiving portion adjacent to the button portion extend along a direction away from the connecting portion and defines a first hinge hole, a side wall of the through groove defines a second hinge hole, the second hinge hole corresponds to the first hinge hole, a hinge shaft sleeved with a torsion spring passes through the second hinge hole and the first hinge hole, the clamping portion is rotatably connected to the connecting portion.

14. The server cabinet of claim 9, wherein the first housing defines a through hole, the button portion is exposed from the through hole.

15. The server cabinet of claim 9, wherein when the first housing provided with the first locking member moves toward the second housing until the latching slot is positioned corresponding to the locking portion, the first locking member is pressed, the locking portion is locked to the latching slot and the first housing is locked to the second housing.

16. The server cabinet of claim 9, wherein when the button portion is pressed, the latching slot is detached from the locking portion, the first housing is dragged to move along a direction away from the second housing, the first housing and the second housing are unlocked.

* * * * *